(12) United States Patent
Powell et al.

(10) Patent No.: US 6,998,356 B2
(45) Date of Patent: Feb. 14, 2006

(54) METHOD OF FABRICATING A SEMICONDUCTOR DEVICE INCLUDING A DIELECTRIC LAYER FORMED USING A REACTIVE AGENT

(75) Inventors: Don Carl Powell, Boise, ID (US); Garry Anthony Mercaldi, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 60 days.

(21) Appl. No.: 10/706,415

(22) Filed: Nov. 12, 2003

(65) Prior Publication Data

US 2004/0106248 A1 Jun. 3, 2004

Related U.S. Application Data

(62) Division of application No. 10/273,667, filed on Oct. 18, 2002, now Pat. No. 6,670,231, which is a division of application No. 09/653,096, filed on Aug. 31, 2000, now Pat. No. 6,576,964.

(51) Int. Cl.
*H01L 21/31* (2006.01)
(52) U.S. Cl. ............... 438/778; 438/780; 438/623; 438/624
(58) Field of Classification Search ........ 438/780–783, 438/778, 623–625
See application file for complete search history.

(56) References Cited

U.S. PATENT DOCUMENTS

| | | | |
|---|---|---|---|
| 5,290,736 A | 3/1994 | Sato et al. | |
| 5,304,398 A | 4/1994 | Krusell et al. | |
| 5,312,776 A | 5/1994 | Murakami et al. | |
| 5,358,739 A | 10/1994 | Baney et al. | |
| 5,525,551 A | 6/1996 | Ohta | |
| 5,567,661 A | 10/1996 | Niishio et al. | |
| 5,814,852 A | 9/1998 | Sandhu et al. | |
| 5,844,771 A | 12/1998 | Graettinger et al. | |
| 5,872,696 A | 2/1999 | Peters et al. | |
| 5,874,766 A | 2/1999 | Hori | |
| 5,882,978 A | 3/1999 | Srinivasan et al. | |
| 5,917,571 A | 6/1999 | Shimada | |
| 6,197,628 B1 | 3/2001 | Vaarstra et al. | |
| 6,258,653 B1 | 7/2001 | Chew et al. | |
| 6,291,288 B1 | 9/2001 | Huang et al. | |
| 6,444,584 B1 * | 9/2002 | Hsiao | 438/706 |
| 6,686,292 B1 * | 2/2004 | Yang et al. | 438/710 |

* cited by examiner

*Primary Examiner*—Dung A. Le
(74) *Attorney, Agent, or Firm*—Dinsmore & Shohl LLP

(57) ABSTRACT

A method of fabricating a semiconductor device including a silicon-containing dielectric layer is provided. In one embodiment, a silicon-containing material is deposited on a substrate. The deposited material is processed with a reactive agent to react with silicon atoms of the deposited material to form the dielectric layer. The silicon-containing dielectric layer provides for improved or smaller semiconductor devices by reducing leakage and increasing the dielectric constant.

4 Claims, 9 Drawing Sheets

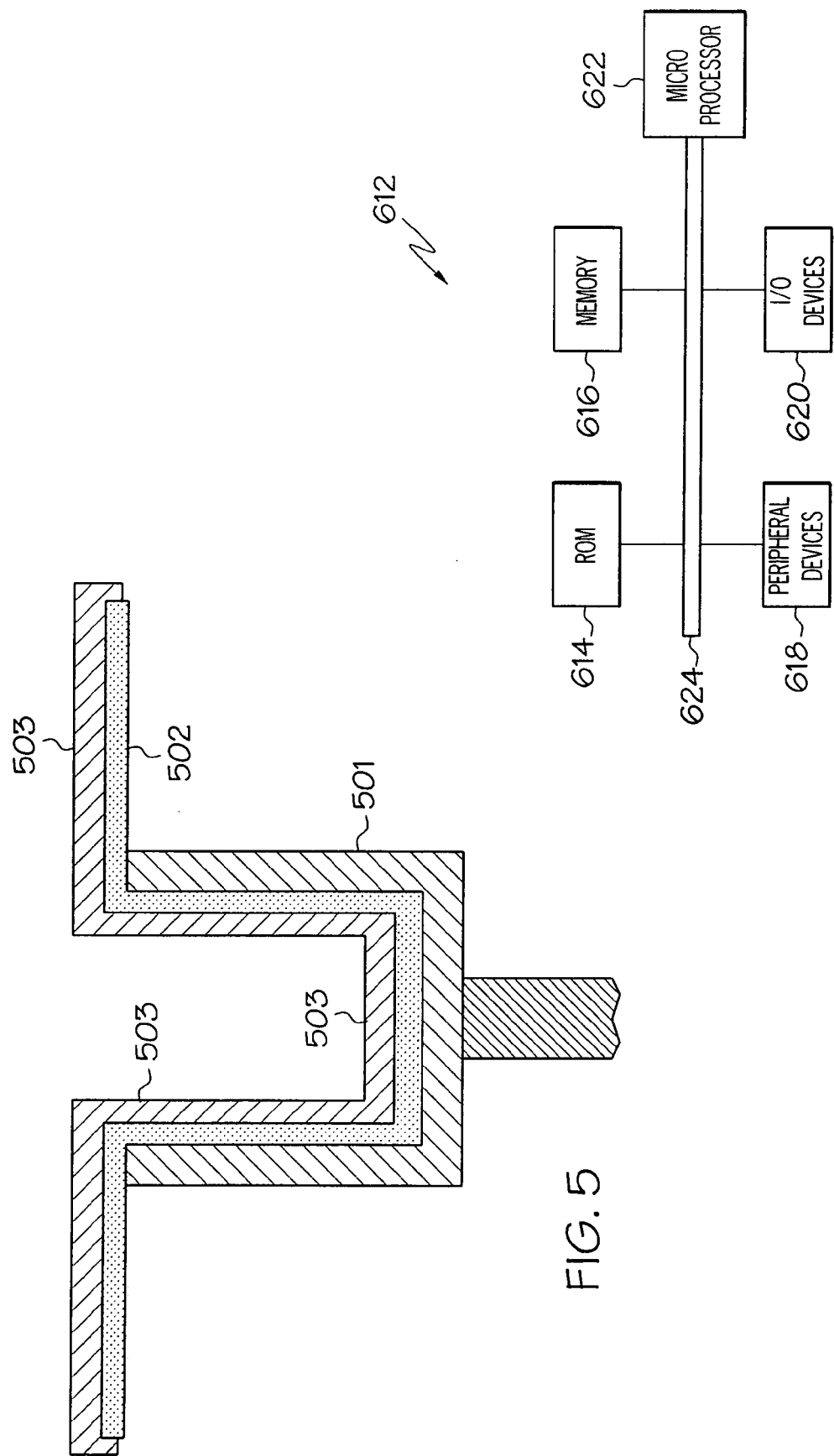

METHOD OF FABRICATING A SEMICONDUCTOR DEVICE INCLUDING A DIELECTRIC LAYER FORMED USING A REACTIVE AGENT

CROSS-REFERENCES TO RELATED APPLICATIONS

This application is a divisional of U.S. patent application Ser. No. 10/273,667 filed Oct. 18, 2002, now U.S. Pat. No. 6,670,231 which is a divisional of U.S. patent application Ser. No. 09/653,096, filed Aug. 31, 2000, now U.S. Pat. No. 6,576,964.

This application is related to commonly assigned U.S. patent application Ser. No. 09/653,639, now U.S. Pat. No. 6,410,968, METHOD FOR FORMING A BARRIER LAYER TO INCREASE SEMICONDUCTOR DEVICE PERFORMANCE, filed Aug. 31, 2000, by Powell et al. and Ser. No. 09/653,298, now U.S. Pat. No. 6,521,544, METHOD FOR FORMING A DIELECTRIC LAYER AT A LOW TEMPERATURE, filed Aug. 31, 2000, by Mercaldi et al., the disclosures of which are incorporated herein by reference.

FIELD OF THE INVENTION

The present invention relates to the field of semiconductors and, more particularly, to an improved dielectric for increasing semiconductor performance.

BACKGROUND OF THE INVENTION

There is a constant demand for semiconductor devices of a reduced size. The performance characteristics of semiconductor capacitors, transistors, electrode layers and the like become more critical as device size decreases. Accordingly, processes that result in increased device performance are critical to improved semiconductor device fabrication.

Capacitors generally have two conductive layers or plates separated by an insulator layer or dielectric layer. Capacitor performance can be improved by increasing the dielectric constant of the dielectric material or decreasing the leakage characteristics of the dielectric material.

Accordingly, there is a need in the art for an improved dielectric layer that has improved characteristics such as lower leakage and a higher dielectric constant.

SUMMARY OF THE INVENTION

This need is met by the present invention, where a silicon-containing material is deposited over at least a portion of a semiconductor device. The deposited silicon-containing material is processed in a reactive ambient to form the dielectric layer.

In accordance with one embodiment of the present invention, a method for fabricating a semiconductor device is disclosed. According to the method, a substrate having at least one semiconductor layer is provided. A first conductive layer is formed over the substrate. A silicon-containing material is deposited over at least a portion of the semiconductor device. The deposited silicon-containing material is processed in a reactive ambient to form a dielectric layer. A second conductive layer is formed over the dielectric layer.

In accordance with yet another embodiment of the present invention, a semiconductor device is disclosed. The semiconductor device includes a substrate, a first conductive layer, a silicon-containing dielectric layer and a second conductive layer. The first conductive layer is formed over the substrate. The silicon-containing layer is formed over the first conductive layer by reacting silicon atoms from a precursor layer with a reactive agent. The second conductive layer is formed over the silicon-containing layer.

Other methods and devices are disclosed.

BRIEF DESCRIPTION OF THE SEVERAL VIEWS OF THE DRAWINGS

The following detailed description of the present invention can be best understood when read in conjunction with the accompanying drawings, where like structure is indicated with like reference numerals.

FIG. 5 illustrates use of a silicon-containing dielectric layer in a capacitor according to another embodiment of the present invention.

FIG. 6 illustrates a computer system that can use and be used with embodiments of the present invention.

DETAILED DESCRIPTION OF THE INVENTION

Figure 1:
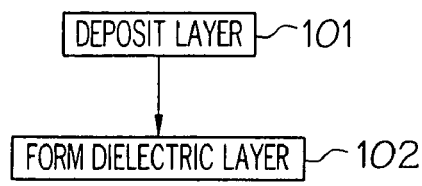
FIG. 1 illustrates a method for forming a dielectric layer according to one embodiment of the present invention.

FIG. 1 illustrates a method for forming a dielectric layer according to one embodiment of the present invention. A silicon-containing layer or precursor layer is deposited over a substrate at block 101. The silicon-containing layer includes material from a silazane or silane source such as, but not limited to hexamethyldisilazane (HMDS). A dielectric layer is formed by processing the silicon-containing layer in a reactive ambient 102. The reactive ambient can be comprised of, but not limited to, $NH_3$, $N_2$, $O_2$, $O_3$, $N_2O$ and NO. The reactive ambient causes silicon atoms from the silicon-containing layer to react with oxygen atom, nitrogen atoms or both. The dielectric layer is primarily nitride, primarily oxide or oxynitride depending on whether the reactive ambient is nitridizing, oxidizing or nitridizing and oxidizing.

Generally, conventional dielectric layers are processed using temperature ranges of 700° C. to 1050° C., processing time of 10 seconds to 60 minutes, and processing pressure of 760 torr. Whereas, the dielectric layer of the present invention is typically processed using temperature ranges of 500° C. to 900° C., processing time of 30 seconds to 5 minutes, and processing pressure of 450 torr. However, with silicon sources such as HMDS, the time is not critical because they are self limiting sources. It is contemplated that variations to these ranges may also result in suitable dielectric layer formation.

Figure 2:
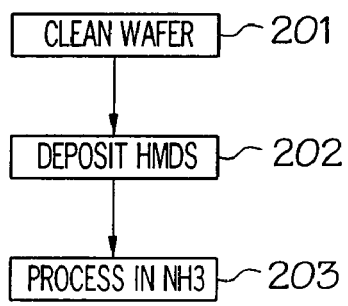
FIG. 2 illustrates a method for forming a dielectric layer according to another embodiment of the present invention.

FIG. 2 illustrates a method of fabricating a silicon-nitride dielectric layer. A wafer is cleaned using hydrofluoric acid (HF) or any other suitable cleaning technique 201. A silicon-containing material, is vapor deposited over the wafer 202 from a silicon source such as HMDS. The silicon-containing material can be deposited using a vapor priming (VP) step. Conventionally, vapor priming is one method that has been used, for example, to minimize the amount of photoresist needed during a patterning process. The vapor prime helps "pre-wet" the semiconductor wafer and allows photoresist to flow out more smoothly, and thus more homogeneously. A dielectric layer is fabricated by rapid thermal nitridization (RTN) of the deposited material in an ammonia nitrogen ($NH_3$) ambient 203. The resulting dielectric layer is primarily nitride.

TABLE 3A

| Split | Wafers | VP | RTN | Dielectric | Thickness |
|---|---|---|---|---|---|
| 301 | 2 | — | 850° C. | Nitride | 45Å |
| 302 | 4, 16 | — | — | Nitride | 45Å |
| 303 | 6, 18 | — | — | Nitride | 55Å |
| 306 | 14 | 1 | 850° C. | Nitride | 35Å |
| 307 | 1, 15 | 2 | 850° C. | Nitride | 35Å |
| 308 | 3, 17 | 2 | 850° C. | Nitride | 45Å |
| 309 | 5, 19 | 2 | 950° C. | Nitride | 35Å |

Table 3A, shown above, shows experimental results for dielectric layers fabricated utilizing the method of FIG. 2A versus conventional dielectric layers. Here, each split represents a set of dielectric layers fabricated according to the same or similar parameters. Splits 302 and 303 are dielectric layers fabricated according to conventional means with a thickness of 45 Å and 55 Å, respectively. Splits 301 and 306–309 are dielectric layers formed according to the present invention. Split 301 is a dielectric layer fabricated using RTN. Split 306 utilizes a single vapor priming (VP) step and a processing temperature of 850° C. to fabricate a dielectric layer at a thickness of 35 Å. Vapor priming or VP is used to deposit a layer of silicon-containing material. Splits 307–309 perform vapor priming twice to deposit two layers of silicon-containing material. Splits 307 and 308 are processed at a temperature of 850° C. to form dielectric layers of 35 Å and 45 Å, respectively. Split 309 is processes at a temperature of 950° C. to form a dielectric layer having a thickness of 35 Å.

Figure 3B:
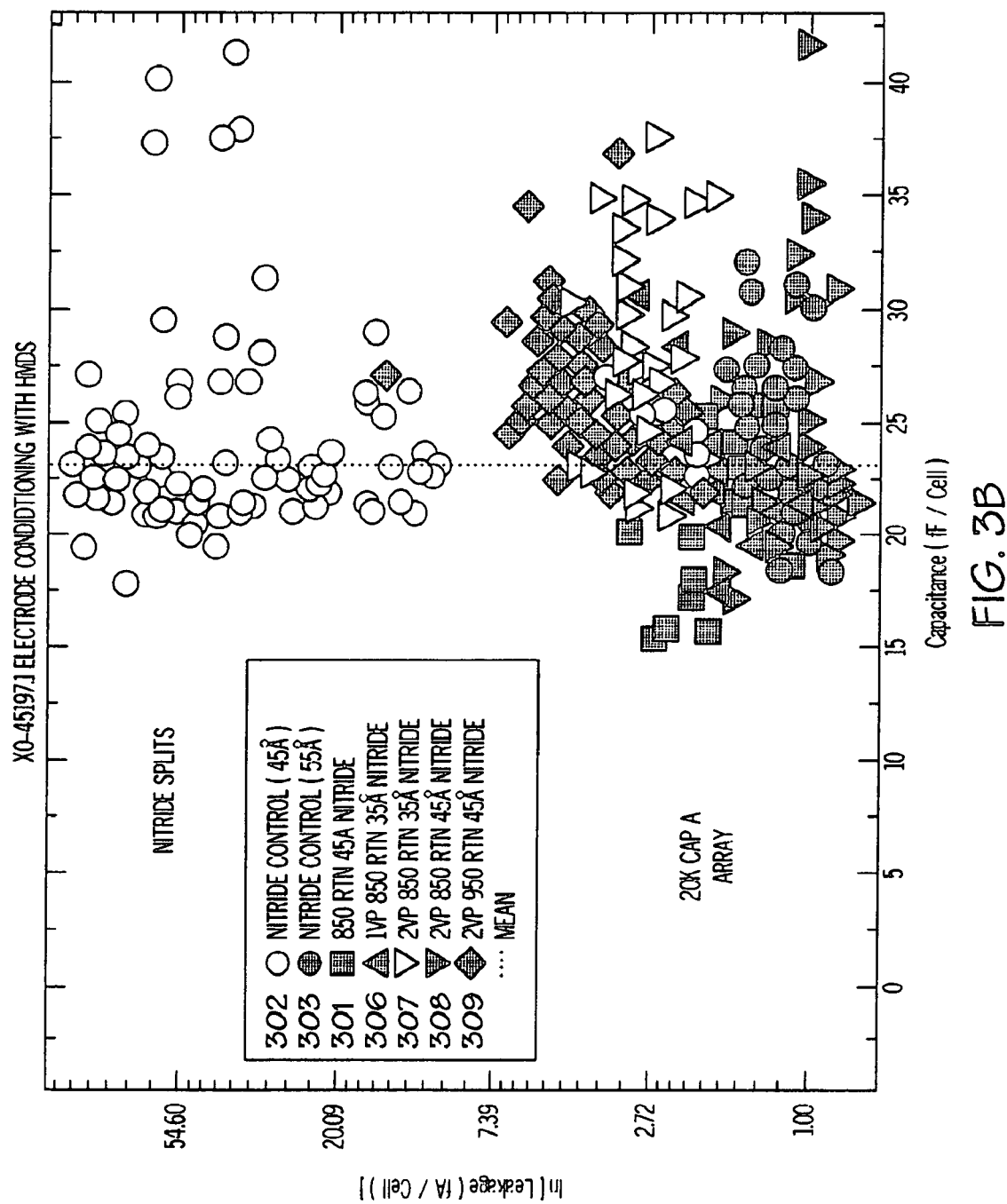
FIG. 3B is a graphical illustration of capacitance versus leakage for various dielectric layers.

FIG. 3B shows capacitance versus leakage for the dielectric layers of table 3A. The leakage is shown on a logarithmic scale. Split 302 demonstrates larger leakage than the other splits. The other splits are well grouped and have less than 7 fA/Cell leakage. Thus, the present invention decreases leakage compared to conventional dielectric layers of comparable thickness.

Figure 3C:
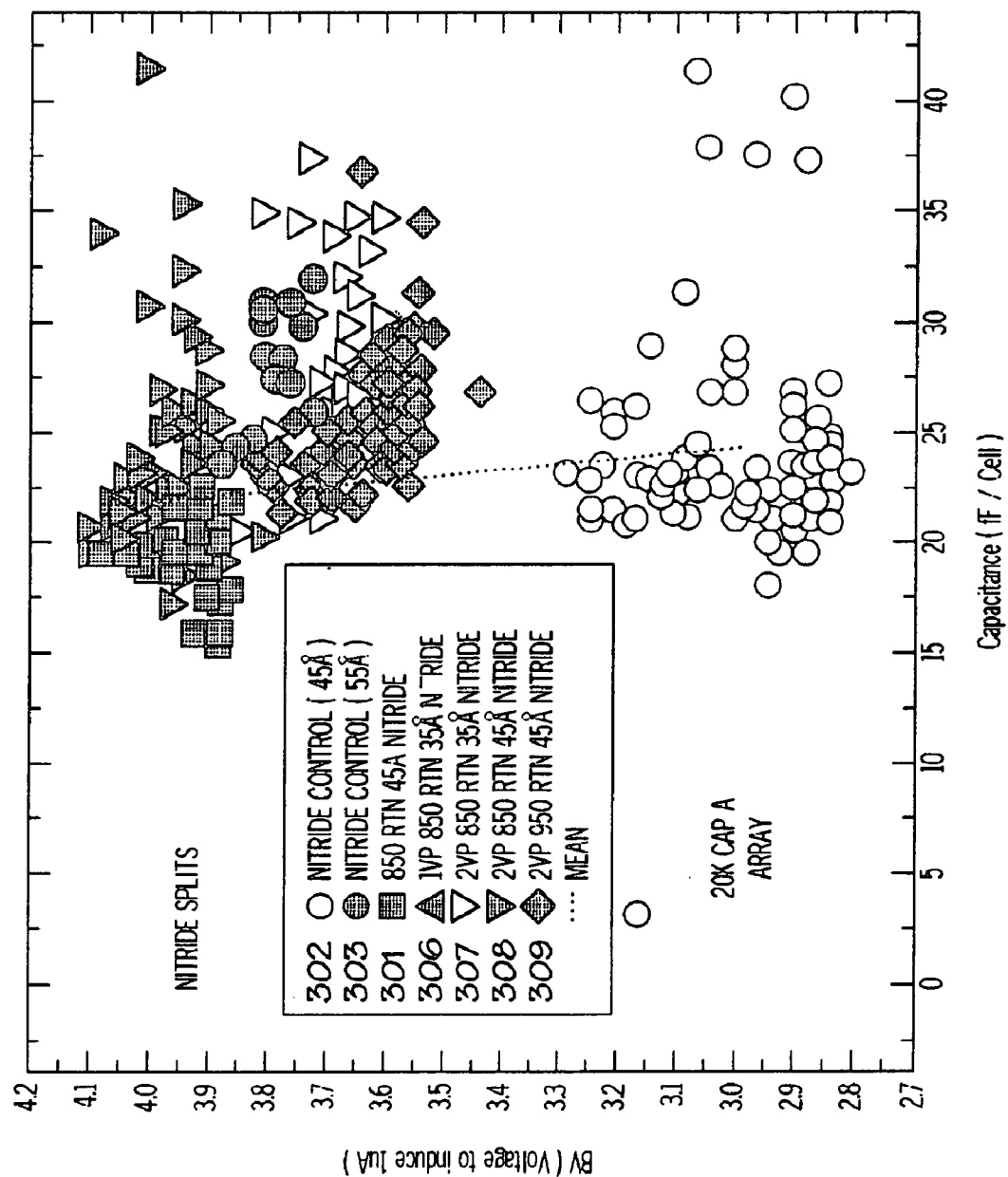
FIG. 3C is a graphical illustration of capacitance versus breakdown voltage for various dielectric layers.

FIG. 3C shows capacitance versus BV (breakdown voltage to induce 1 uA) for the dielectric layers of table 3A. This figure shows the BV of the 302 split at around 3.0V. This behavior in leakage and BV is indicative of 45 Å nitride. The remaining splits demonstrate higher BV. It is worth noting that the less thick splits, 306, 307 and 309 even demonstrate a higher BV. A higher BV indicates a large increase in dielectric strength. Thus, it can be seen that the present invention increases dielectric strength.

Figure 3D:
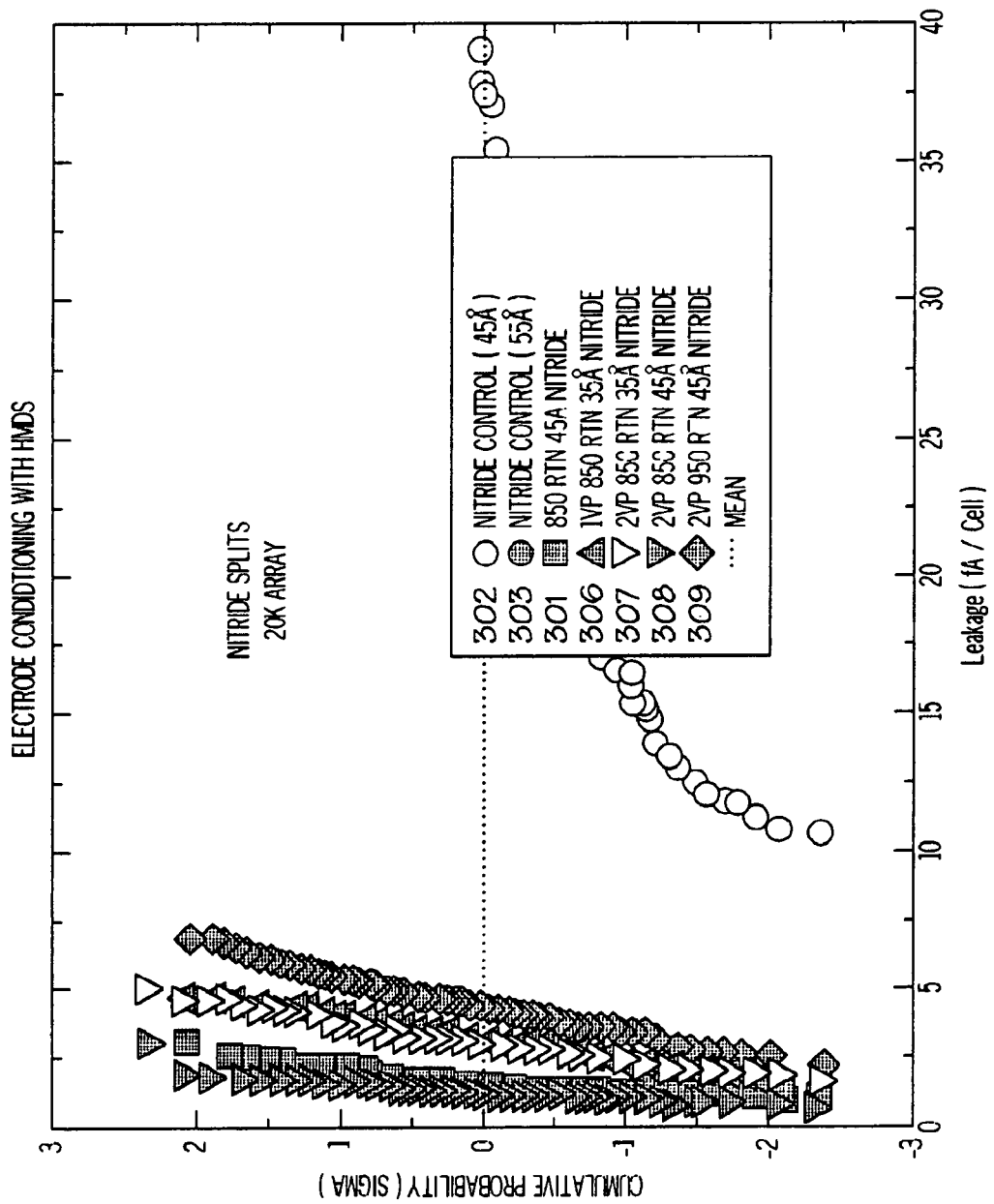
FIG. 3D is a graphical illustration of the cumulative probability of leakage for various dielectric layers.
Figure 3E:
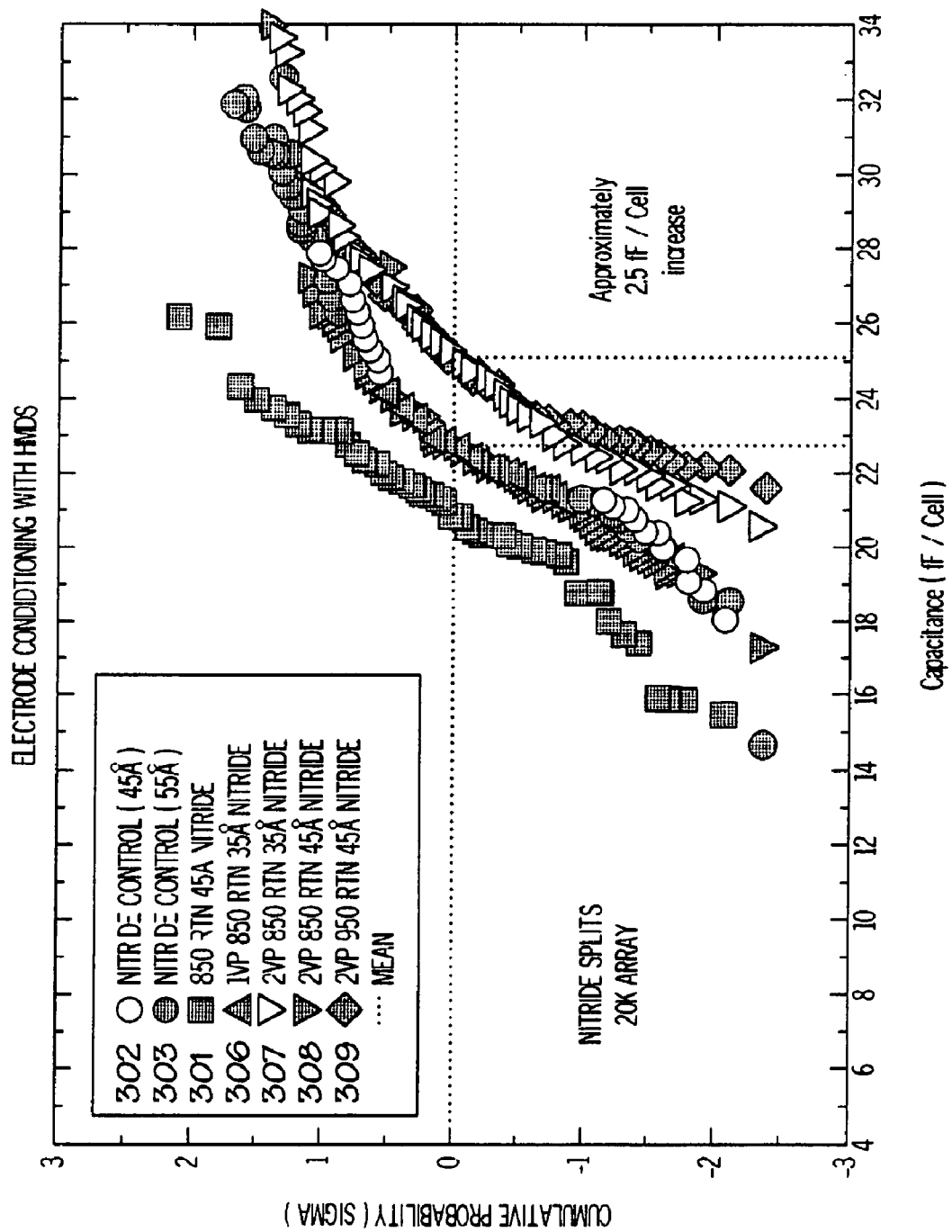
FIG. 3E is a graphical illustration of the cumulative probability versus capacitance for various dielectric layers.
Figure 3F:
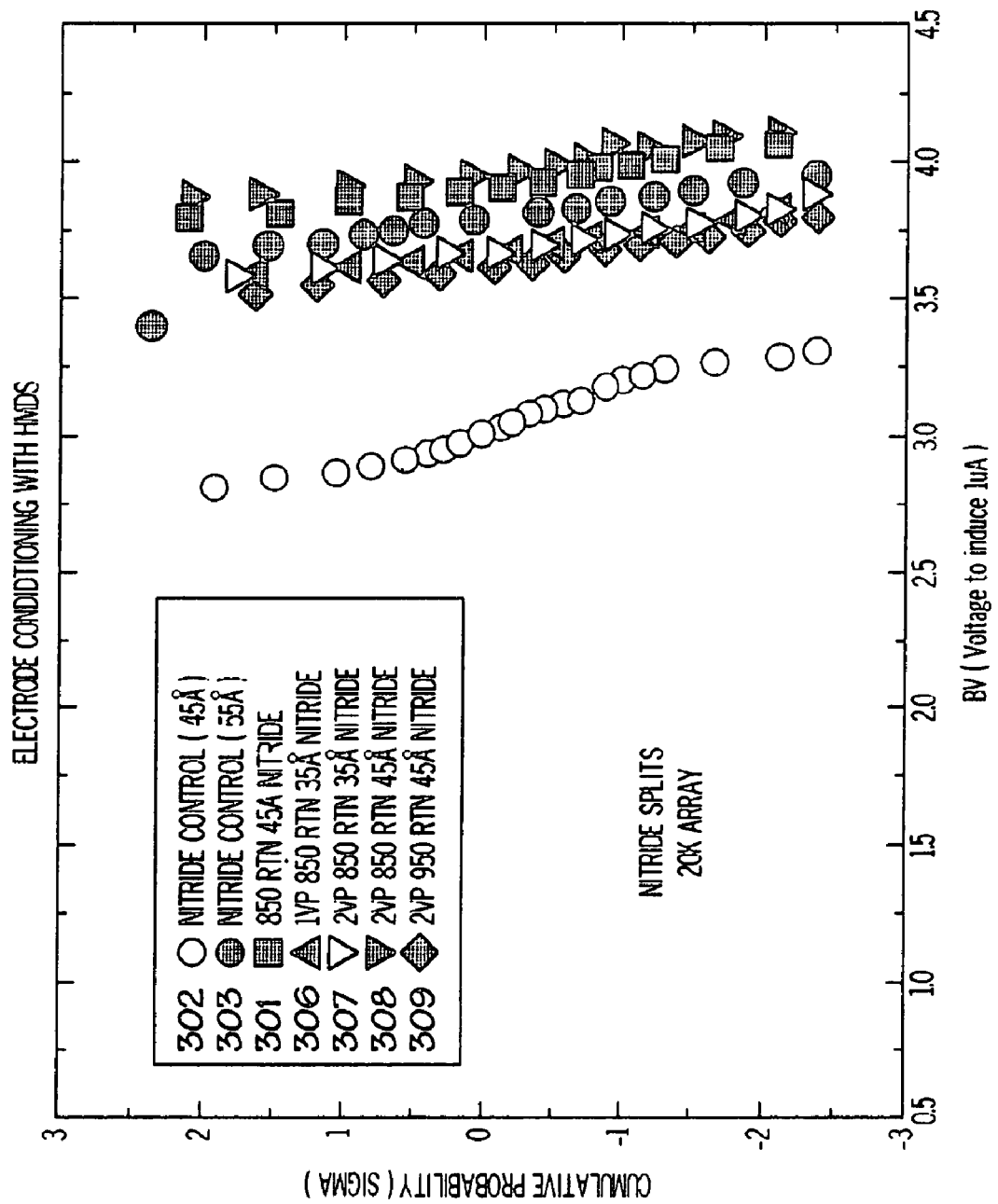
FIG. 3F is a graphical illustration of the cumulative probability versus breakdown voltage.

FIG. 3D shows the cumulative probability of leakage for the dielectric layers of table 3A. The leakage probability of split 302 is unacceptable and all other splits are comparable to split 303, the 55 Å thick control dielectric layer which is thicker than the other splits. Thus, it can be seen that the present invention lowers leakage probability of dielectric layers of comparable thickness. FIG. 3E shows the cumulative probability versus capacitance. A 2.5 fF/cell gap is seen between split 303 and the best remaining splits. Thus, it can be seen that the present invention demonstrates an increase in capacitance over conventional dielectrics. Similarly, FIG. 3F shows the cumulative probability versus BV and a significant gap between split 302 and the other splits. This shows that the dielectric layers of the present invention demonstrate improved back voltage characteristics over conventional dielectrics of comparable thickness.

Figure 3G:
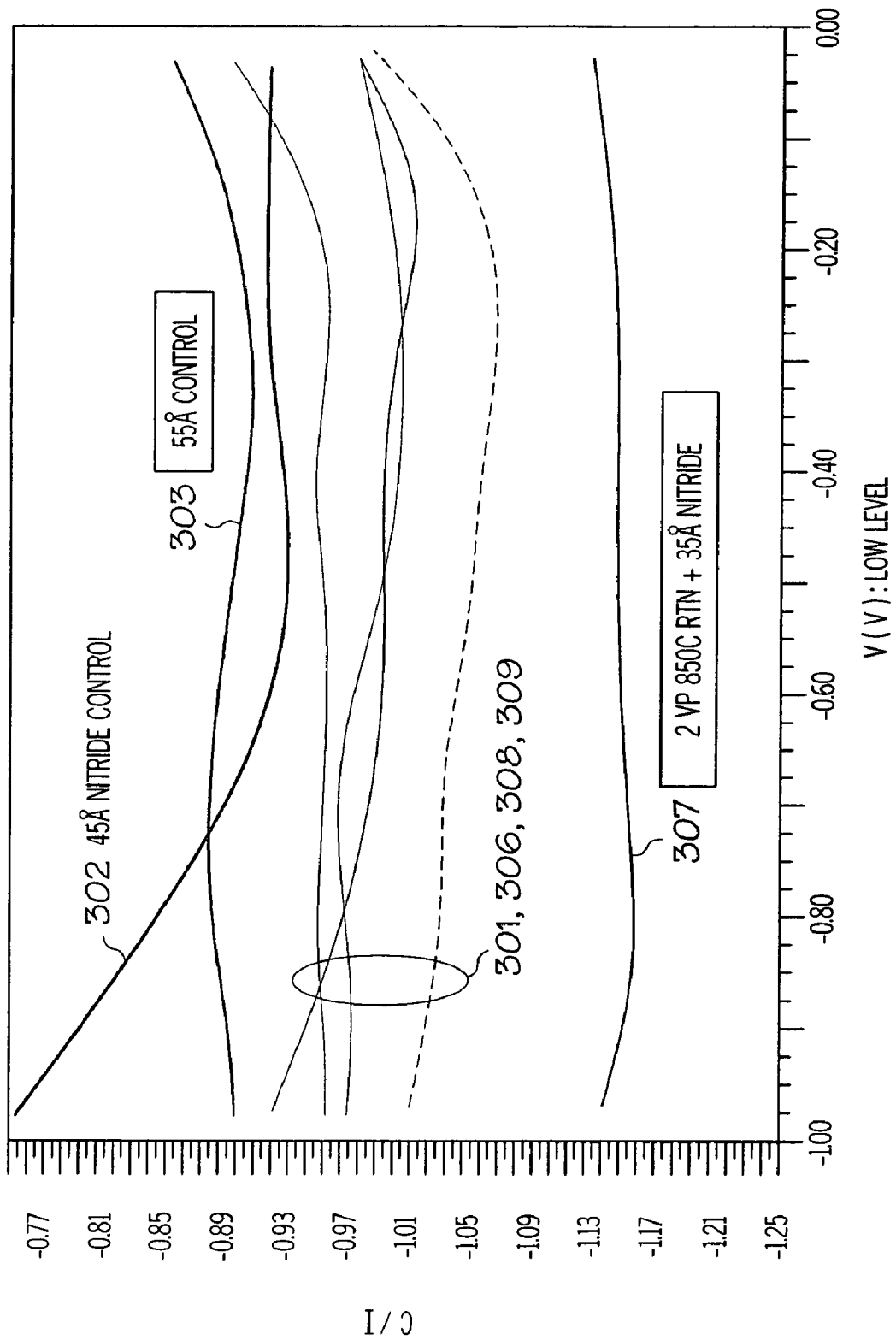
FIG. 3G is a graphical illustration of the performance index versus low level voltages for various dielectric layers.
Figure 3H:
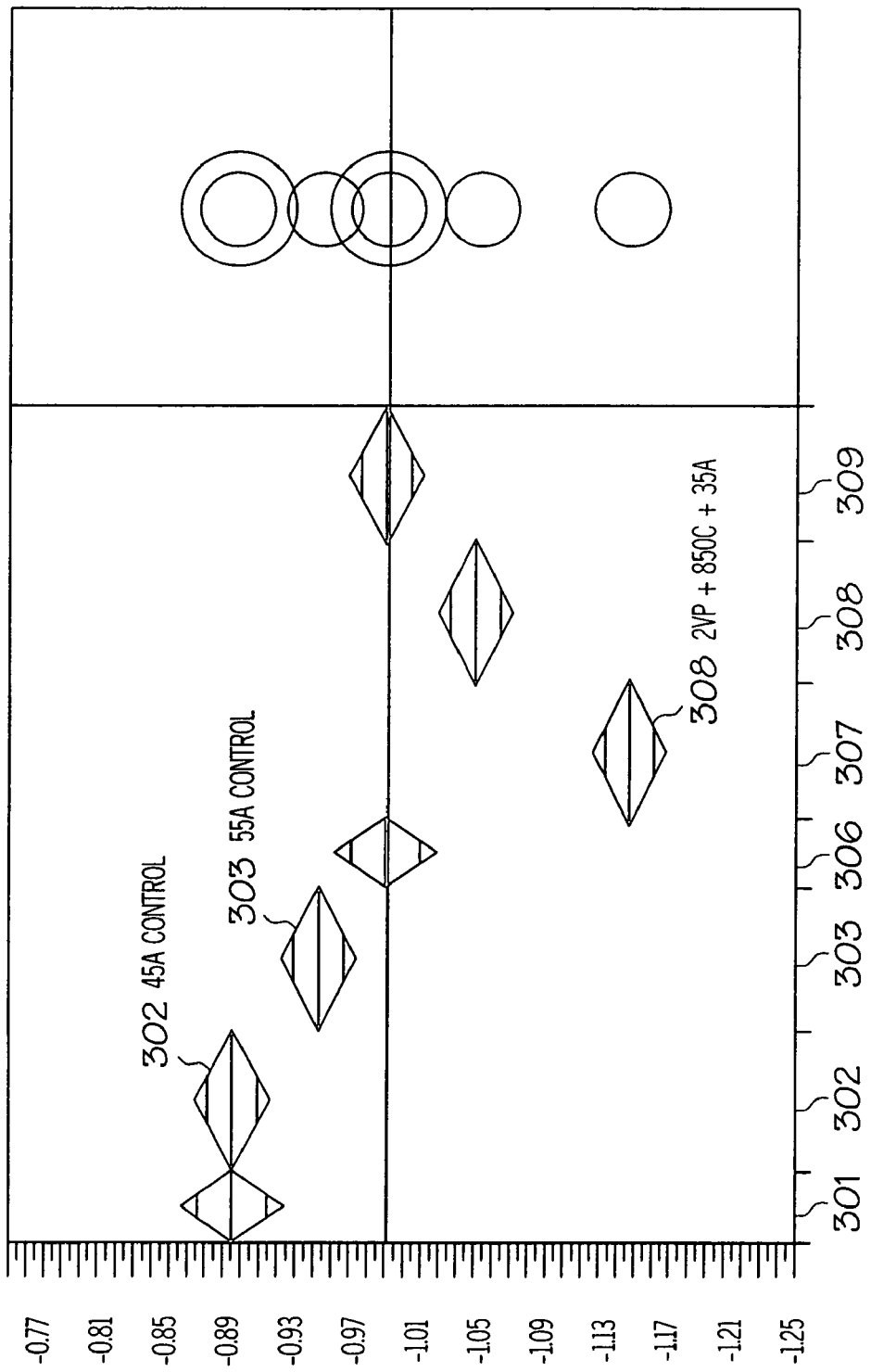
FIG. 3H is a graphical illustration of the performance index for various dielectric layers.

FIG. 3G shows a performance index C/I (capacitance over current) versus low level voltages for the dielectric layers of table 3A. The data for the graph was gathered using keithley CV and IV sweeps. The bias voltage was swept from +1V to −1V while measuring capacitance. The IV sweep swept bias voltage from 0 to −1V and measured 20K array current. The performance of the 302 split significantly degrades over a range of approximately 0.6V. This performance degradation is a result of leakage increases. The best performance of the splits is shown by split 307 which uses 2VP, a processing temperature of 850° C. and a 35 Å thickness. FIG. 3H shows the performance index C/I for the various dielectric layers of table 3A. The vertical axis is the performance index C/I and the horizontal axis shows the various splits. The circles on the right hand side of the graph show the differences between the various dielectric layers. If the circles do not intersect, the difference between splits is significant. Splits 307, 308 and 309 are significantly better in performance than control splits 302 and 303.

Table 3A and FIGS. 3B, 3C, 3D, 3E, 3F, 3G and 3H show exemplary experimental results of actual implementations. It can be seen from those figures that thinner dielectric layers fabricated according to the present invention are able to perform as well or better that thicker conventional dielectric layers. Other actual implementations may vary and embodiments of the present invention are not limited to the implementations shown in table 3A and FIGS. 3B, 3C, 3D, 3E, 3F, 3G and 3H.

Figure 4:
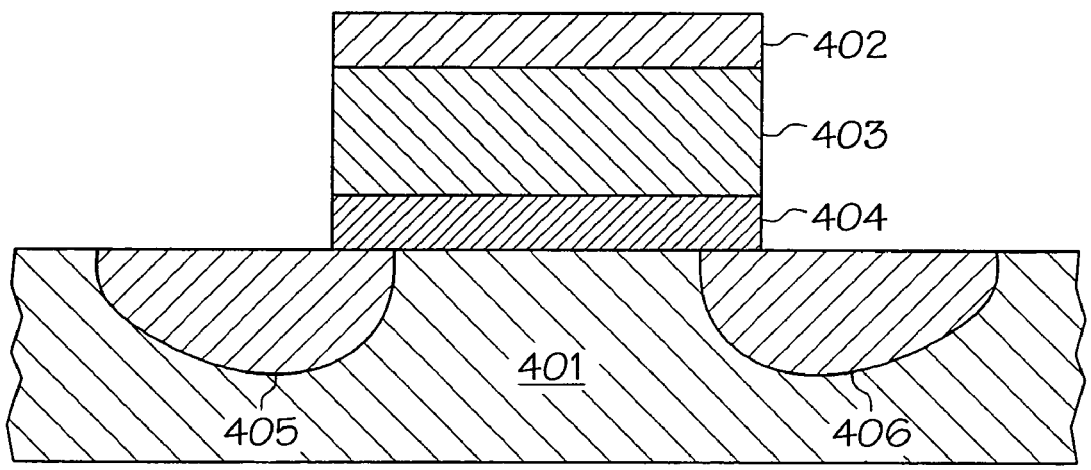
FIG. 4 illustrates a semiconductor device according to another embodiment of the present invention.

FIG. 4 illustrates a transistor semiconductor device utilizing a dielectric layer 402 according to another embodiment of the present invention. A source 405 is formed in a substrate 401. A drain 406 is formed in the substrate 401. A gate oxide layer 404 is formed over the substrate 401 from the source 405 to the drain 406. An electrode or gate electrode 403 is formed over the gate oxide layer 404. A dielectric layer 402 is formed over the electrode 403.

The dielectric layer 402 is fabricated by vapor depositing a selected material or precursor and subsequently processing those materials. The selected material can be deposited by using vapor priming (VP). The selected material is a silicon containing material such as silazane or silane type materials. An example of a typical silicon-containing material is hexamethyldisilazane (HMDS). Other materials or precursors which may be used are tetramethyldisilazane, octamethylcyclotetrasilazine, hexamethylcyclotrisilazine, diethylaminotrimethylsilane or dimethylaminotrimethylsilane. The selected material can be deposited a single time or the depositing can be repeated any number of times. The selected material is processed in a reactive ambient to create a final desirable silicon-containing dielectric layer. The reactive ambient can be materials such as $NH_3$, $N_2$, $O_2$, $O_3$, $N_2$, NO and the like and cause silicon atoms of the selected material to react with oxygen atoms, nitrogen atoms or both.

The resulting silicon-containing dielectric layer is the dielectric layer 402 and can result in a layer that is primarily nitride, primarily oxide or an oxynitride.

FIG. 5 illustrates use of a silicon-containing dielectric layer 502 in a capacitor according to another embodiment of the present invention. The silicon-containing dielectric layer 502 is formed over an electrode 501. The silicon-containing dielectric layer 502 is created by depositing a silicon-containing precursor material from a silazane or silane source. The layer is then processed in a reactive ambient. The reactive ambient causes silicon atoms in the precursor layer to react with oxygen atoms, nitrogen atoms or both to form the silicon-containing dielectric layer. A second dielectric layer 503 is formed over the silicon-containing dielectric layer 502. The second dielectric layer 503 may be of a material susceptible to oxygen migration such as $Ta_2O_5$ and may be formed using conventional methods. The electrode 501 may be composed of a material such as P—Si, SiGe or metal. The remaining capacitor structure is formed according to conventional methodology.

FIG. 6 is an illustration of a computer system 612 that can use and be used with embodiments of the present invention. As will be appreciated by those skilled in the art, the computer system 612 would include ROM 614, mass memory 616, peripheral devices 618, and I/O devices 620 in communication with a microprocessor 622 via a data bus 624 or another suitable data communication path. The ROM 614 and mass memory 616 can be fabricated using silicon-containing dielectric layers according to the various embodiments of the present invention.

For the purposes of describing and defining the present invention, formation of a material "on" a substrate or layer refers to formation in contact with a surface of the substrate or layer. Formation "over" a substrate or layer refers to formation above or in contact with a surface of the substrate. A "substrate" may comprise one or more semiconductor layers or semiconductor structures which may define portions of a semiconductor device.

Dielectric layers fabricated using the present invention can be used for a variety of purposes. Some examples follow, but embodiments of the present invention are not limited to these. A dielectric layer can be used as a covering on a semiconductor device. A dielectric layer according to the present invention can be used in a gate structure of a transistor or in an anti-fuse application. A dielectric layer according to the present invention can be formed on top of metals to prevent oxidation of metals. A dielectric layer according to the present invention can be used in post gate stack and pre oxidation steps to prevent oxygen in-diffusion into active areas of the transistor. A dielectric layer according to the present invention can be used to prevent oxidation of gate electrodes with subsequent processing steps when using materials such as polysilicon, Si—Ge, W or other transistion metals. A dielectric layer according to the present invention can be used in anti-fuse components of a semiconductor device.

Additionally, multiple dielectric layers formed according to the various embodiments of the present invention can be used in a single device and can be stacked or intermixed with other types of dielectric layers.

Semiconductor devices fabricated utilizing the present invention can be improved compared to other semiconductor devices because the dielectric of this invention can provide an increased dielectric constant and reduced leakage. This may also permit reductions in the size of semiconductor devices.

Having described the present invention in detail and by reference to preferred embodiments thereof, it will be apparent that modifications and variations are possible without departing from the scope of the present invention defined in the appended claims.

What is claimed is:

1. A method of fabricating a semiconductor device comprising:
   providing a substrate having at least one semiconductor layer;
   forming a conductive layer over the substrate;
   vapor priming a first silicon-containing material over the gate oxide;
   vapor priming a second silicon-containing material over the first silicon-containing material;
   forming a silicon-containing dielectric layer having a thickness of about 35 Å by processing the first silicon-containing material and the second silicon-containing material with a reactive agent selected to react with silicon atoms of the first silicon-containing material and the second silicon-containing material; and
   forming a gate electrode over the silicon-containing dielectric layer.

2. The method of claim 1 further comprising:
   doping the gate electrode with phosphor.

3. The method of claim 1 further comprising:
   doping the gate electrode with boron.

4. The method of claim 1 wherein processing the silicon-containing material in a reactive ambient comprises rapid thermally nitridizing the silicon-containing material in an $NH_3$ ambient at a processing temperature of 850° C.

* * * * *